(12) United States Patent
Yang et al.

(10) Patent No.: US 12,726,179 B2
(45) Date of Patent: Sep. 1, 2026

(54) DIGITAL VARIABLE REACTANCE ELEMENT, PHASE SHIFTER, AND IMPEDANCE MATCHING CIRCUIT

(71) Applicant: Murata Manufacturing Co., Ltd., Nagaokakyo (JP)

(72) Inventors: Bo Yang, Kyoto (JP); Naoki Shinohara, Kyoto (JP); Tsuyoshi Kajiwara, Kyoto (JP); Takayuki Okada, Nagaokakyo (JP); Takaaki Miyasako, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 24 days.

(21) Appl. No.: 18/802,007

(22) Filed: Aug. 13, 2024

(65) Prior Publication Data

US 2024/0405751 A1 Dec. 5, 2024

Related U.S. Application Data

(63) Continuation of application No. PCT/JP2023/033010, filed on Sep. 11, 2023.

(30) Foreign Application Priority Data

Dec. 2, 2022 (JP) ................................ 2022-193674

(51) Int. Cl.
*H03H 11/16* (2006.01)
*H03H 11/28* (2006.01)

(52) U.S. Cl.
CPC ............ *H03H 11/16* (2013.01); *H03H 11/28* (2013.01)

(58) Field of Classification Search
CPC ................................ H03H 11/16; H03H 11/18
See application file for complete search history.

(56) References Cited

U.S. PATENT DOCUMENTS 7,893,790 B2 * 2/2011 Van Delden .............. H03F 1/56 333/101
8,253,426 B2 * 8/2012 Tateishi .................. G11B 9/06 324/658

(Continued)

FOREIGN PATENT DOCUMENTS

JP 09074325 A 3/1997
JP 2014530543 A 11/2014

(Continued)

OTHER PUBLICATIONS

International Search Report in PCT/JP2023/033010, mailed Oct. 24, 2023, 2 pages.

(Continued)

*Primary Examiner* — Menatoallah Youssef
*Assistant Examiner* — Colleen J O Toole
(74) *Attorney, Agent, or Firm* — Keating & Bennett, LLP

(57) ABSTRACT

A digital variable reactance element includes digital capacitors and digital inductors connected in series or in parallel. Each of the digital capacitors includes a capacitor and a first digital switch connected in series or in parallel. The first digital switch is switchable between on and off states. Each of the digital inductors includes an inductor and a second digital switch connected in series or in parallel. The second digital switch is switchable between on and off states.

18 Claims, 8 Drawing Sheets

(56) References Cited

U.S. PATENT DOCUMENTS

| | | | | |
|---|---|---|---|---|
| 10,666,219 | B2 * | 5/2020 | De Foucauld | H03H 7/40 |
| 11,005,532 | B2 * | 5/2021 | Bieber | H04B 1/16 |
| 11,942,898 | B2 * | 3/2024 | Jurkov | H03F 3/19 |
| 2009/0109880 | A1 * | 4/2009 | Kim | H04B 1/50 370/278 |
| 2011/0227666 | A1 * | 9/2011 | Manssen | H03K 17/56 333/32 |
| 2013/0063223 | A1 | 3/2013 | See et al. | |
| 2016/0181986 | A1 | 6/2016 | Perreault et al. | |
| 2017/0084998 | A1 | 3/2017 | Ishizuka | |

FOREIGN PATENT DOCUMENTS

| | | | |
|---|---|---|---|
| JP | 2022110070 | A | 7/2022 |
| WO | 2015178204 | A1 | 11/2015 |

OTHER PUBLICATIONS

Written Opinion in PCT/JP2023/033010, mailed Oct. 24, 2023, 3 pages.

* cited by examiner 1A
6A
2A
2A
2A
4A
4A
Q
R1
C1
C2
L1
L2

FIG. 4

10
RF_IN
11
RF_OUT
Z0, λ /4
13
Z0/√2, λ /4
14
Z0/√2, λ /4
12
13_OUT
14_OUT
Z0, λ /4
1(1A,1B)
1(1A,1B)

FIG. 6

| ps[deg] | C[pF] | L[nH] |
|---|---|---|
| 0 | 0.1 | |
| 10 | 0.2 | |
| 20 | 0.3 | |
| 30 | 0.4 | |
| 40 | 0.6 | |
| 50 | 0.8 | |
| 60 | 1 | |
| 70 | 1.4 | |
| 80 | 2 | |
| 90 | 3 | |
| 100 | 5.6 | |
| 110 | 22 | |
| 125 | | 0.1 |
| 130 | | 0.15 |
| 140 | | 0.22 |
| 150 | | 0.3 |
| 160 | | 0.38 |
| 170 | | 0.45 |
| 180 | | 0.53 |
| 190 | | 0.6 |
| 200 | | 0.68 |
| 210 | | 0.76 |
| 220 | | 0.85 |
| 230 | | 0.95 |
| 240 | | 1.05 |
| 250 | | 1.17 |
| 260 | | 1.31 |
| 270 | | 1.47 |
| 280 | | 1.68 |
| 290 | | 1.94 |
| 300 | | 2.3 |
| 310 | | 2.8 |
| 320 | | 3.7 |
| 330 | | 5.6 |
| 340 | | 11.7 |
| 347 | | 28 |

DIGITAL VARIABLE REACTANCE ELEMENT, PHASE SHIFTER, AND IMPEDANCE MATCHING CIRCUIT

CROSS REFERENCE TO RELATED APPLICATIONS

This application claims the benefit of priority to Japanese Patent Application No. 2022-193674 filed on Dec. 2, 2022 and is a Continuation Application of PCT Application No. PCT/JP2023/033010 filed on Sep. 11, 2023. The entire contents of each application are hereby incorporated herein by reference.

BACKGROUND OF THE INVENTION

1. Field of the Invention

The present invention relates to digital variable reactance elements, phase shifters, and impedance matching circuits.

2. Description of the Related Art

For example, a phase shifter for use in a microwave circuit includes a variable reactance element. A variable capacitor, such as a variable condenser, a varicap, or a varactor diode, has been known as such a variable reactance element (see, for example, Japanese Unexamined Patent Application, Publication No. H09-074325).

As is the case with a radio-frequency phase shifter, an increase in the frequency f triggers a reduction in the range of phase shift provided by a phase shifter, resulting in greater loss. Thus, a need arises for variable reactance elements having a reactance ($\frac{1}{2}\pi fc$) that is variable over a wider range.

Such variable reactance elements include a variable inductor. Unfortunately, a known variable reactance element that has been used is only either a variable capacitor or a variable inductor.

As shown in the Smith chart of FIG. 8, insertion of a capacitor or an increase in capacitance causes the reactance (impedance) to vary in the arrow direction D_C. In contrast, insertion of an inductor or an increase in inductance causes the reactance (impedance) to vary in the arrow direction D_L. As can be seen, each of the variable capacitor and the variable inductor causes the reactance to vary in one direction, which varies between the variable capacitor and the variable inductor.

Thus, if the reactance is controlled so as to be variable over a wider range, a plurality of variable capacitors or a plurality of variable inductors need to be used. Control signals for the plurality of variable capacitors or the plurality of variable inductors are complicated.

SUMMARY OF THE INVENTION

Example embodiments of the present invention provide digital variable reactance elements, phase shifters, and impedance matching circuits each with a wide variable range.

A digital variable reactance element according to an example embodiment of the present invention is directed to a digital variable reactance element that digitally varies a reactance. The digital variable reactance element includes a plurality of digital capacitors, and a plurality of digital inductors. The plurality of digital capacitors and the plurality of digital inductors are connected together in series or in parallel. Each of the plurality of digital capacitors includes a capacitor and a first digital switch connected together in series or in parallel. The first digital switch is switchable between an on state and an off state. Each of the plurality of digital inductors includes an inductor and a second digital switch connected together in series or in parallel. The second digital switch is switchable between an on state and an off state.

A phase shifter according to an example embodiment of the present invention includes a digital variable reactance element according to an example embodiment of the present invention. The phase shifter is structured to generate an output signal with a phase corresponding to a digitally varied phase of an input signal.

An impedance matching circuit according to an example embodiment of the present invention includes a digital variable reactance element according to an example embodiment of the present invention. The impedance matching circuit is structured to match a characteristic impedance to a line connected to the impedance matching circuit.

According to example embodiments of the present invention, digital variable reactance elements are able to each provide a reactance that is variable over a wider range. According to example embodiments of the present invention, a range of phase shift provided phase shifters is increased. According to example embodiments of the present invention, a range of matching of impedance matching circuits is increased.

The above and other elements, features, steps, characteristics and advantages of the present invention will become more apparent from the following detailed description of the example embodiments with reference to the attached drawings.

BRIEF DESCRIPTION OF THE DRAWINGS

FIG. 4 is a circuit diagram showing an exemplary phase shifter according to an example embodiment of the present invention.

FIG. 6 shows a design of the exemplary phase shifter shown in FIG. 4.

Figure 8:
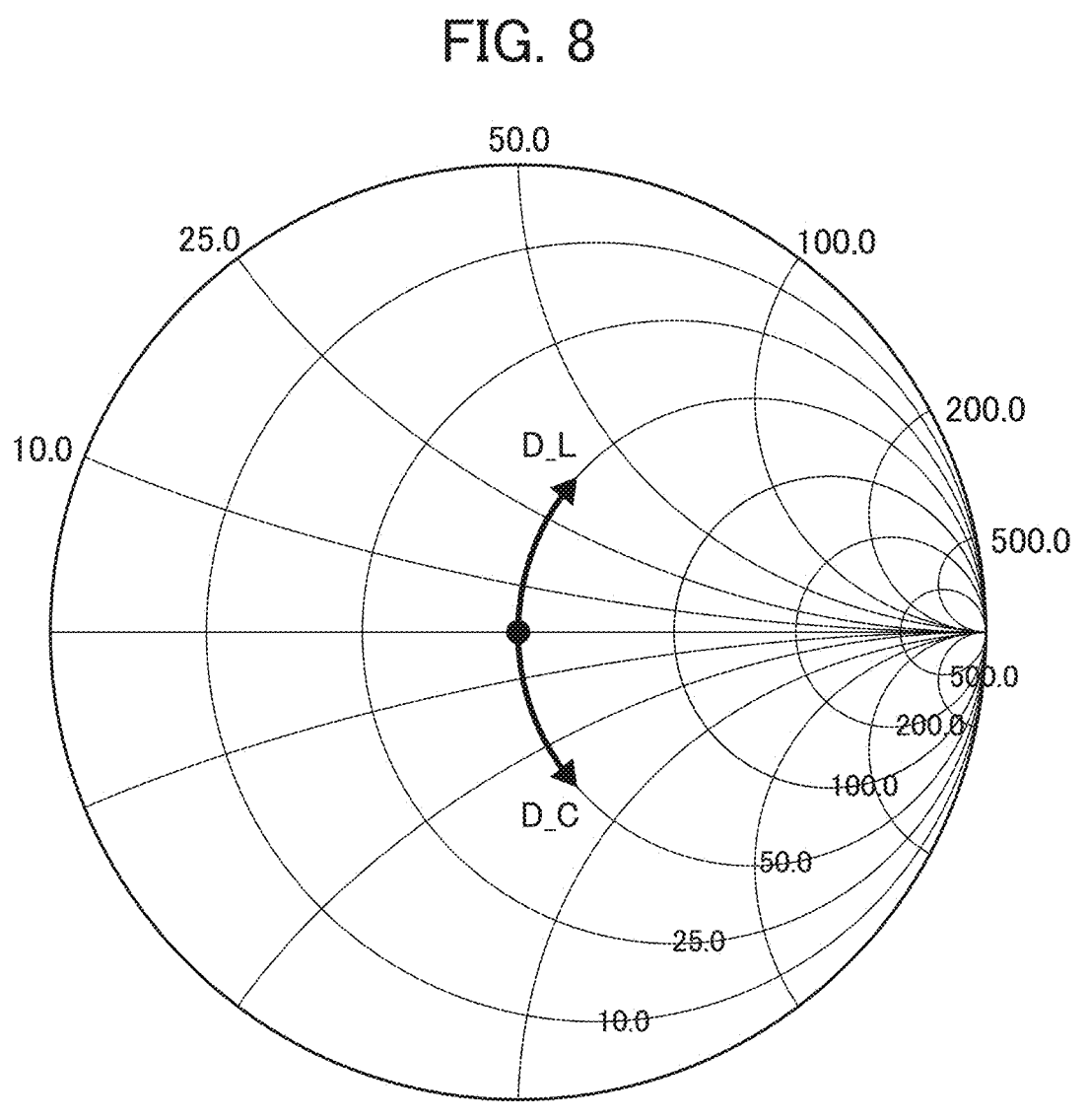

FIG. 8 is a Smith chart showing exemplary reactance characteristics.

DETAILED DESCRIPTION OF THE EXAMPLE EMBODIMENTS

Figure 1:
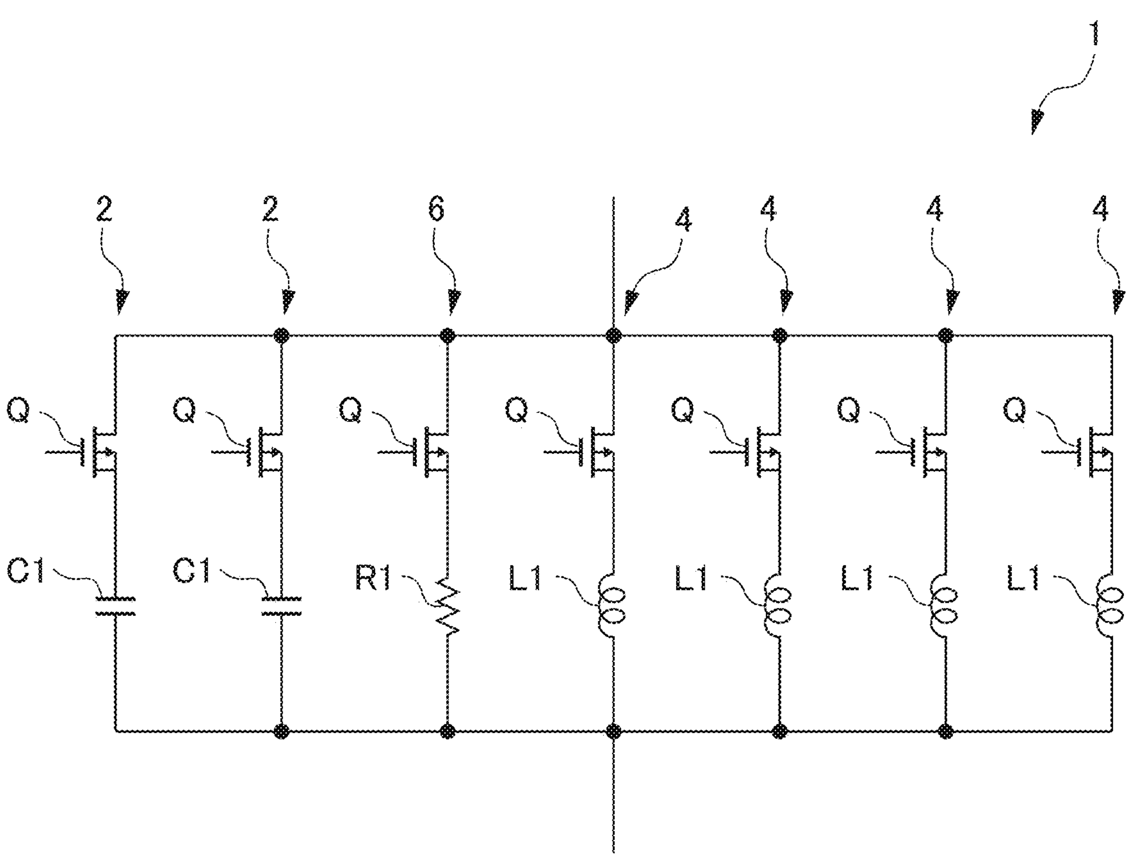
FIG. 1 is a circuit diagram showing a digital variable reactance element according to an example embodiment of the present invention.

Example embodiments of the present invention will be described below with reference to the accompanying drawings. The same reference numerals are used to represent the same or equivalent elements in figures.

Digital Variable Reactance Element of an Example Embodiment

FIG. 1 is a circuit diagram showing a digital variable reactance element according to an example embodiment of the present invention. As shown in FIG. 1, a digital variable reactance element 1 is an element that digitally varies the reactance. The digital variable reactance element 1 includes a plurality of digital capacitors 2 and a plurality of digital inductors 4. The digital variable reactance element 1 may include a digital resistor 6. In the digital variable reactance element 1, the plurality of digital capacitors 2, the plurality of digital inductors 4, and the digital resistor 6 are connected together in parallel.

The digital capacitors 2 each include a capacitor C1 and a digital switch (first digital switch) Q connected together in series. Non-limiting examples of the digital switch Q to be used include a switching element, such as a field effect transistor (FET). The digital switch Q is switchable between two states, which are on and off states. Thus, each digital capacitor 2 is switchable between two values, which are a first value being the capacitance of the associated capacitor C1 (a state where the digital switch Q is on) and a second value being the capacitance 0 (a state where the digital switch Q is off). In other words, the digital capacitor 2 has a digitally switchable capacitance.

The digital inductors 4 each include an inductor L1 and a digital switch (second digital switch) Q connected together in series. Non-limiting examples of the digital switch Q to be used include a switching element, such as a field effect transistor (FET). The digital switch Q is switchable between two states, which are on and off states. Thus, each digital inductor 4 is switchable between two values, which are a first value being the inductance of the associated inductor L1 (a state where the digital switch Q is on) and a second value being the inductance 0 (a state where the digital switch Q is off). In other words, the digital inductor 4 has a digitally switchable inductance.

The digital resistor 6 includes a resistor R1 and a digital switch Q connected together in series. Non-limiting examples of the digital switch Q to be used include a switching element, such as a field effect transistor (FET). The digital switch Q is switchable between two states, which are on and off states. Thus, each digital resistor 6 is switchable between two values, which are a first value being the resistance of the resistor R1 (a state where the digital switch Q is on) and a second value being the resistance 0 (a state where the digital switch Q is off). In other words, the digital resistor 6 has a digitally switchable resistance.

Thus, the variable reactance element 1 can digitally vary the reactance through switching between the on and off states of each of the digital switches Q. The variable reactance element 1 can digitally vary the impedance, in particular, the impedance to a radio-frequency (RF) signal, through switching between the on and off states of each of the digital switches Q.

As described above, the digital variable reactance element 1 of the present example embodiment digitally varies the reactance provided by the plurality of capacitors C1 and the plurality of inductors L1 under control performed by the digital switches Q. The digital variable reactance element 1 digitally varies the impedance provided by the plurality of capacitors C1, the plurality of inductors L1, and the resistor R1 under control performed by the digital switches Q.

The inductance as well as the capacitance is variable, and the reactance can be widely varied either to capacitive reactance (½πfc) or to inductive reactance (2πfL). This allows the reactance (½πfc+2πfL) to be variable over a wider range.

Furthermore, a plurality of variable capacitors or a plurality of variable inductors do not need to be used. This substantially prevents control signals for the plurality of variable capacitors or the plurality of variable inductors from being complicated.

In addition, a low-loss radio frequency (RF) phase shifter with a wide range of phase shift can be achieved.

In the present example embodiment, the variable reactance element 1 has been exemplified. The variable reactance element 1 includes the plurality of digital capacitors 2 each including the capacitor C1 and the digital switch Q connected together in series, and the plurality of digital inductors 4 each including the inductor and the digital switch connected together in series or in parallel. The digital capacitors 2 and the digital inductors 4 are connected together in parallel. This variable reactance element 1 is merely an example of the present invention. The present invention is applicable to various variable reactance elements each of which includes a plurality of digital capacitors each including a capacitor and a digital switch connected together in series or in parallel, and a plurality of digital inductors each including an inductor and a digital switch connected together in series or in parallel and each of which has its digital capacitors and its digital inductors connected together in series or in parallel. First and second variations of the present example embodiment will be described below.

Digital Variable Reactance Element of First Variation

Figure 2:
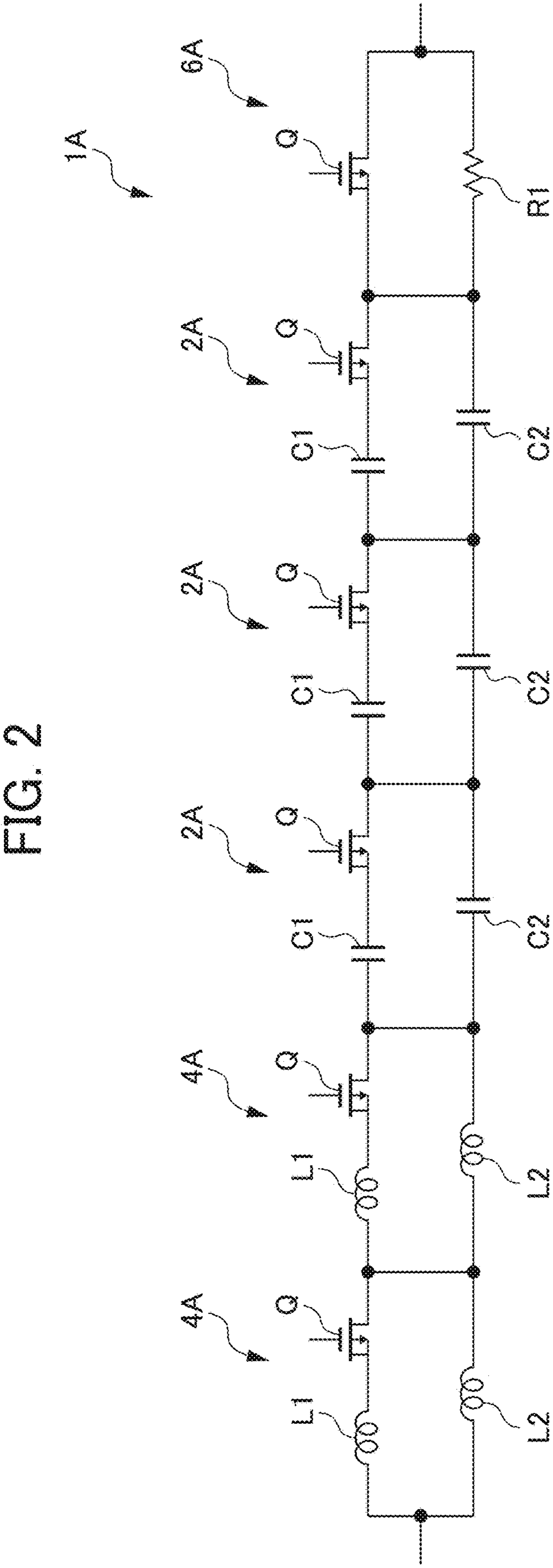
FIG. 2 is a circuit diagram showing a digital variable reactance element according to a first variation of an example embodiment of the present invention.

FIG. 2 is a circuit diagram showing a digital variable reactance element according to a first variation of the present example embodiment. As shown in FIG. 2, a digital variable reactance element 1A is an element that digitally varies the reactance. The digital variable reactance element 1A includes a plurality of digital capacitors 2A and a plurality of digital inductors 4A. The digital variable reactance element 1A may include a digital resistor 6A. In the digital variable reactance element 1A, the plurality of digital capacitors 2A, the plurality of digital inductors 4A, and the digital resistor 6A are connected together in series.

The digital capacitors 2A each include a capacitor C1 and a digital switch (first digital switch) Q connected together in series, and a capacitor C2 connected to the digital switch Q in parallel. Specifically, in each digital capacitor 2A, a series circuit with the capacitor C1 and the digital switch Q is connected to the capacitor C2 in parallel. The above description applies also to the digital switch Q. Thus, each digital capacitor 2A is switchable between two values, which are a first value being the combined capacitance of the associated capacitors C1 and C2 (a state where the digital switch Q is on) and a second value being the capacitance of the capacitor C2 (a state where the digital switch Q is off). In other words, the digital capacitor 2A has a digitally switchable capacitance.

The digital inductors 4A each include an inductor L1 and a digital switch (second digital switch) Q connected together in series, and an inductor L2 connected to the digital switch Q in parallel. Specifically, in each digital inductor 4A, a series circuit with the inductor L1 and the digital switch Q is connected to the inductor L2 in parallel. The above description applies also to the digital switch Q. Thus, each digital inductor 4A is switchable between two values, which are a first value being the combined inductance of the associated inductors L1 and L2 (a state where the digital switch Q is on) and a second value being the inductance of the inductor L2 (a state where the digital switch Q is off). In other words, the digital inductor 4A has a digitally switchable inductance.

The digital resistor 6A includes a resistor R1 and a digital switch Q connected together in parallel. The above description applies also to the digital switch Q. Thus, the digital resistor 6A is switchable between two values, which are a first value being the resistance 0 (a state where the digital switch Q is on) and a second value being the resistance of the resistor R1 (a state where the digital switch Q is off). In other words, the digital resistor 6A has a digitally switchable resistance.

Thus, the variable reactance element 1A can digitally vary the reactance through switching between the on and off states of each of the digital switches Q. The variable reactance element 1A can digitally vary the impedance, in particular, the impedance to a radio-frequency (RF) signal, through switching between the on and off states of each of the digital switches Q.

The digital variable reactance element 1A of this first variation also has advantages that are the same as or similar to those of the digital variable reactance element 1 of the example embodiment described above.

Digital Variable Reactance Element of Second Variation

Figure 3:
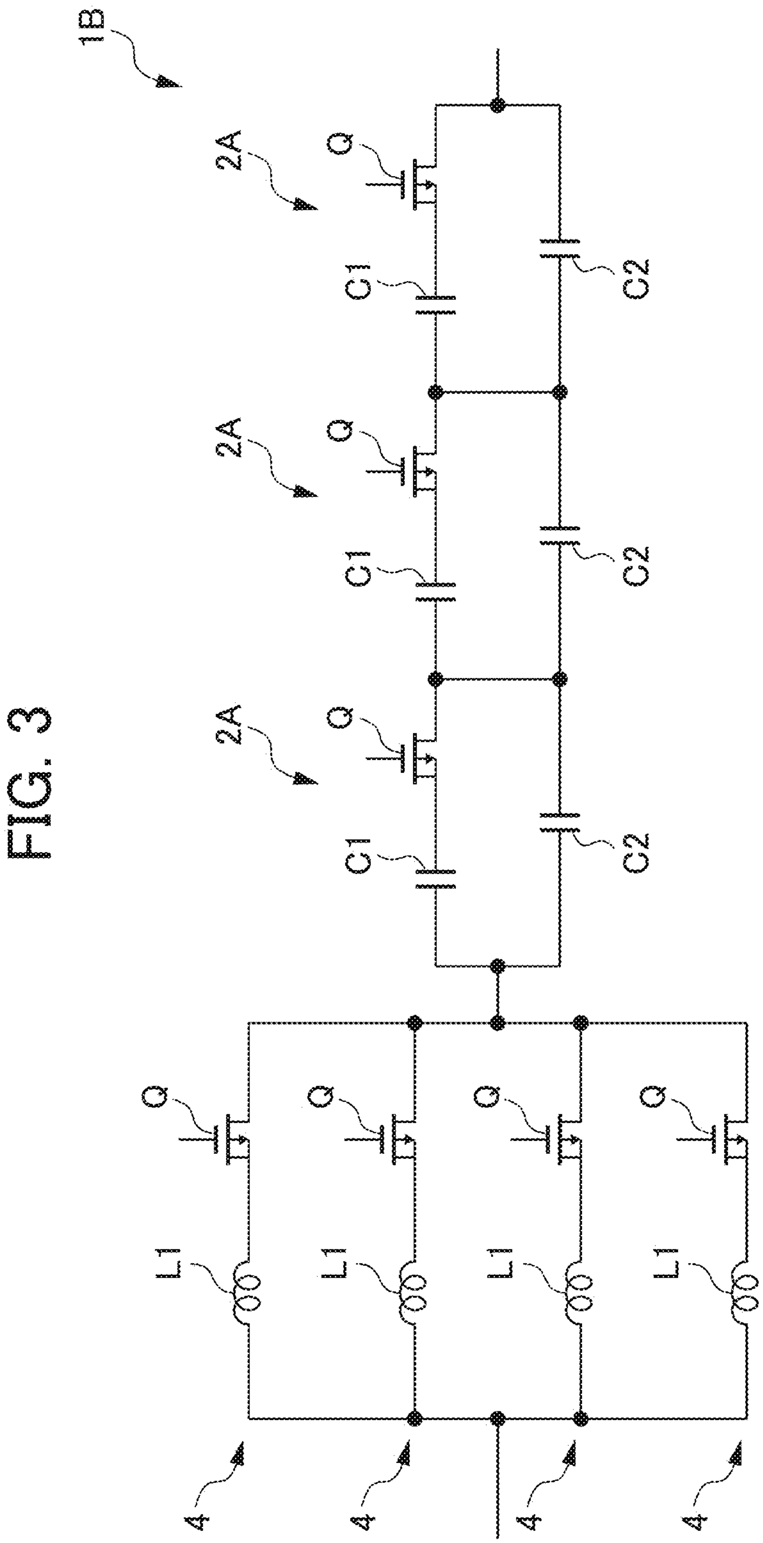
FIG. 3 is a circuit diagram showing a digital variable reactance element according to a second variation of an example embodiment of the present invention.

FIG. 3 is a circuit diagram showing a digital variable reactance element according to a second variation of the present example embodiment. As shown in FIG. 3, a digital variable reactance element 1B is an element that digitally varies the reactance. The digital variable reactance element 1B includes the plurality of digital capacitors 2A described above and the plurality of digital inductors 4 described above. In the digital variable reactance element 1B, the plurality of digital capacitors 2A are connected together in series, the plurality of digital inductors 4 are connected together in parallel, and a series circuit with the digital capacitors 2A and a parallel circuit with the digital inductors 4 are connected together in series.

Thus, the variable reactance element 1B can digitally vary the reactance through switching between the on and off states of each of the digital switches Q. The variable reactance element 1B can digitally vary the impedance, in particular, the impedance to a radio-frequency (RF) signal, through switching between the on and off states of each of the digital switches Q.

The digital variable reactance element 1B of the second variation also has advantages the same as or similar to those of the digital variable reactance element 1 of the example embodiment described above.

A phase shifter and an impedance matching circuit will be described below as exemplary devices including the digital variable reactance element described above. The digital variable reactance element of the present example embodiment can be used not only for these devices but also for various devices that require variation of the reactance or the impedance, such as, for example, a variable load, a detector circuit for magnetic resonance imaging (MRI), a voltage-controlled oscillator (VCO), a phase lock loop, and a frequency synthesizer.

Phase Shifter of an Example Embodiment

Figure 4:
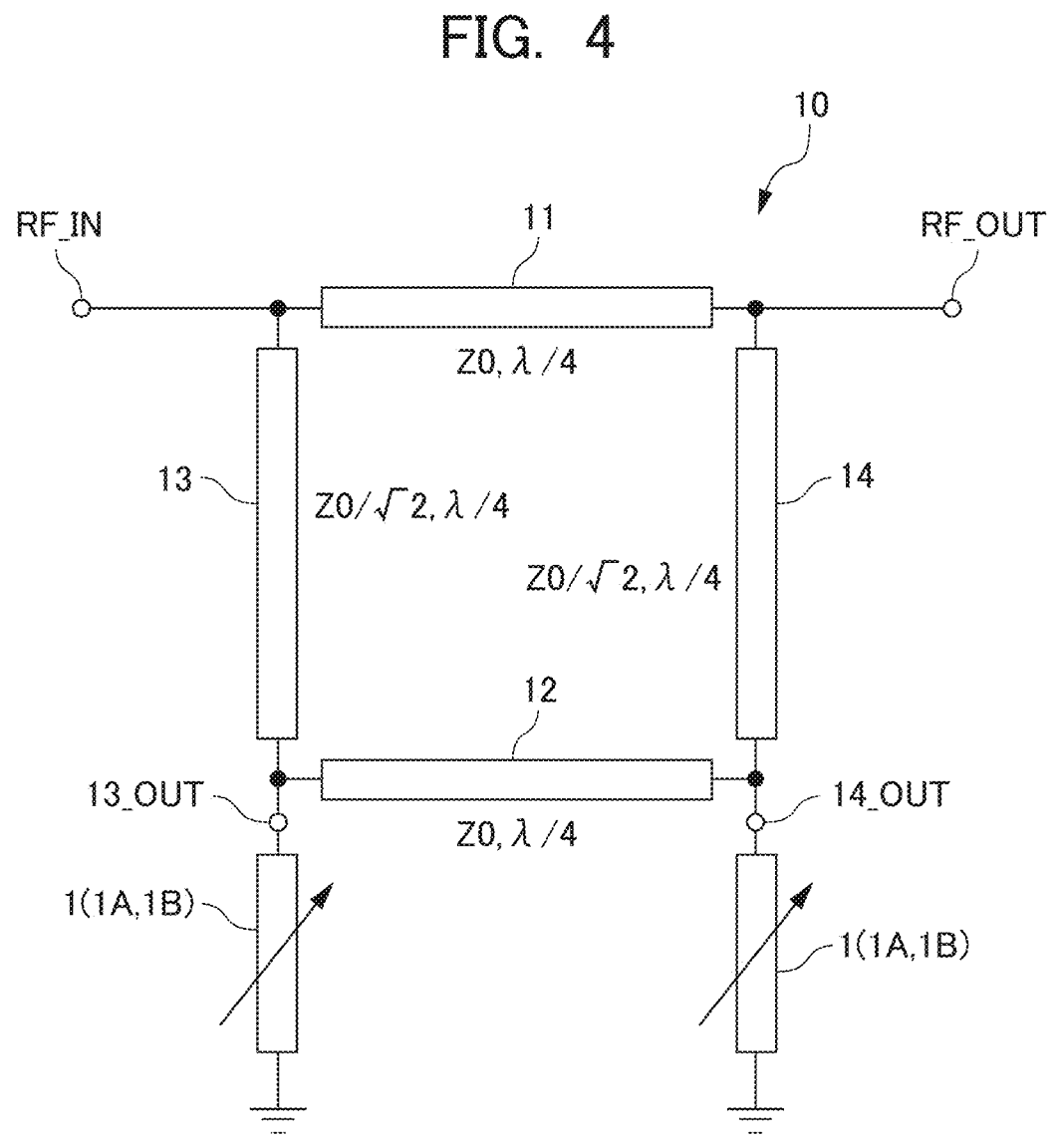
Figure 5:
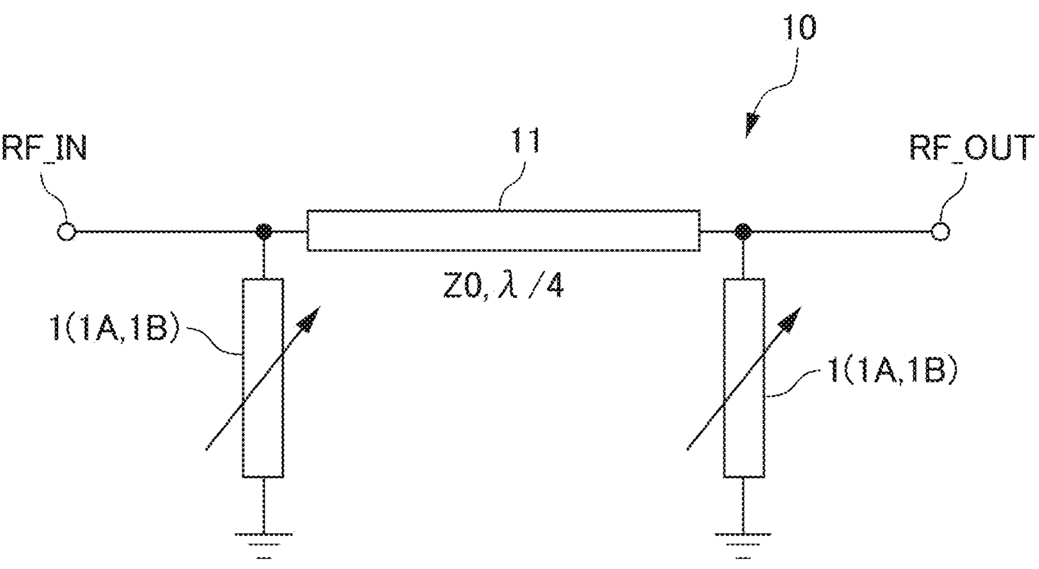
FIG. 5 is a circuit diagram showing another exemplary phase shifter according to an example embodiment of the present invention.

FIG. 4 is a circuit diagram showing an exemplary phase shifter according to an example embodiment of the present invention, and FIG. 5 is a circuit diagram showing another exemplary phase shifter according to an example embodiment of the present invention. The phase shifter 10 shown in FIG. 4 is a hybrid coupled radio-frequency (RF) phase shifter including quarter-wave lines 11 and 12 with a characteristic impedance Z0 and quarter-wave lines 13 and 14 with a characteristic impedance Z0/√2. The line 11 of the phase shifter 10 includes an input terminal RF_IN at one end thereof, and an output terminal RF_OUT at the other end. The phase shifter 10 includes variable reactance elements 1 (1A, 1B) that each terminate an associated one of an output terminal 13_OUT of the line 13 and an output terminal 14_OUT of the line 14.

In the phase shifter 10, an RF signal received from the input terminal RF_IN is distributed among the hybrid coupled lines 11, 12, 13, and 14, and is transmitted to the output terminal 13_OUT of the line 13 and the output terminal 14_OUT of the line 14. Since these output terminals 13_OUT and 14_OUT are terminated by the associated variable reactance elements 1 (1A, 1B) described above, the signal transmitted to each of these output terminals undergoes phase shift dependent on the amount of reactance of the associated variable reactance element 1 (1A, 1B), and is then reflected. The signals reflected from these output terminals 13_OUT and 14_OUT are again combined together through the hybrid coupled lines 11, 12, 13, and 14, and the resultant signal is output from the output terminal RF_OUT. At this time, the output signal undergoes phase shift dependent on the amounts of reactance of the variable reactance elements 1 (1A, 1B) described above. Changing the amounts of reactance of the variable reactance elements described above allows the phase shifter 10 to operate as a phase shifter.

FIG. 4 shows an example in which the hybrid coupled phase shifter 10 includes the variable reactance elements 1 (1A, 1B) described above. Alternatively, as shown in FIG. 5, a loaded-line phase shifter 10 including a quarter-wave line 11 with a characteristic impedance Z0 may include the variable reactance elements 1 (1A, 1B) described above.

FIG. 6 shows a design of the exemplary phase shifter shown in FIG. 4. In FIG. 6, the amount of phase shift ps provided by the phase shifter shown in FIG. 4 was measured using a network analyzer with the capacitance C of a digital capacitor or the inductance L of a digital inductor varied. As shown in FIG. 6, phase shift characteristics over about 360° were obtained. As can be seen, the radio frequency phase shifter including the digital variable reactance element of the example embodiment described above can widely vary the reactance either to capacitive reactance or to inductive reactance. This enables achievement of a low-loss radio frequency (RF) phase shifter with a wide range of phase shift.

Matching Circuit of an Example Embodiment

Figure 7:
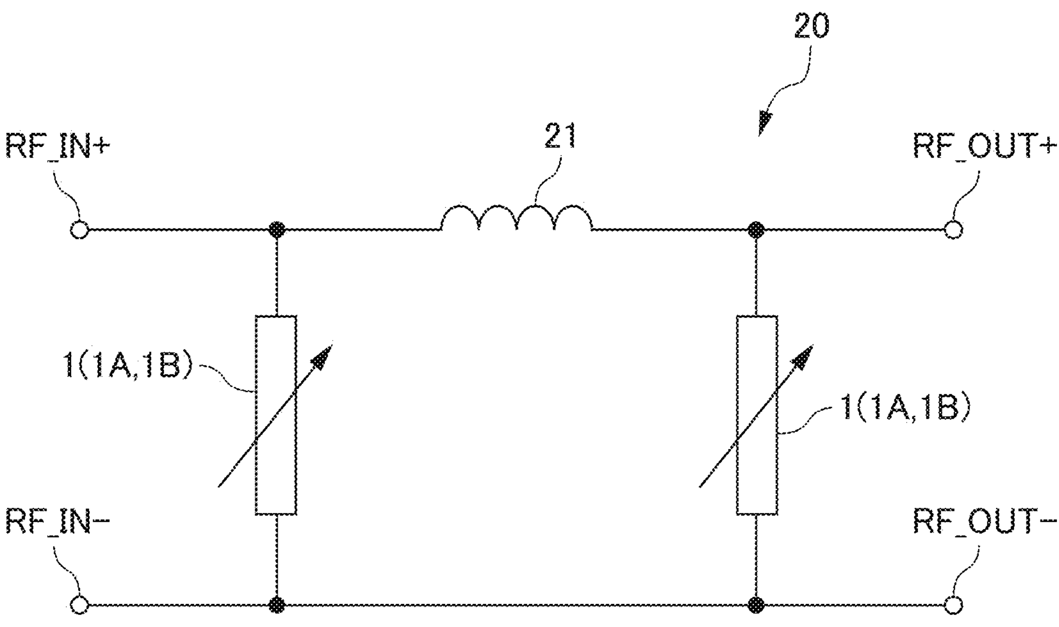
FIG. 7 is a circuit diagram showing an exemplary impedance matching circuit according to an example embodiment of the present invention.

FIG. 7 is a circuit diagram showing an exemplary impedance matching circuit according to an example embodiment of the present invention. An impedance matching circuit 20 shown in FIG. 7 includes an inductor 21 connected in series between one (RF_IN+) of a pair of input terminals RF_IN+ and RF_IN− and one (RF_OUT+) of a pair of output terminals RF_OUT+ and RF_OUT−, and the above-described variable reactance elements 1 (1A, 1B) connected between the pair of input terminals RF_IN+ and RF_IN− and between the pair of output terminals RF_OUT+ and RF_OUT−.

Changing the amounts s of impedance of the variable reactance elements 1 (1A, 1B) described above allows the impedance matching circuit 20 to operate as an impedance matching circuit.

As can be seen, the impedance matching circuit including the digital variable reactance element of the example embodiment described above can widely vary the reactance either to capacitive reactance or to inductive reactance. This enables achievement of a low-loss impedance matching circuit with a wide adjustable impedance range.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A digital variable reactance element that digitally varies a reactance, the digital variable reactance element comprising:
 a plurality of digital capacitors;
 a plurality of digital inductors; and
 a digital resistor connected in parallel to the plurality of digital capacitors and the plurality of digital inductors; wherein
 the plurality of digital capacitors and the plurality of digital inductors are connected together in series or in parallel;
 each of the plurality of digital capacitors includes a capacitor and a first digital switch connected together in series or in parallel, the first digital switch being switchable between an on state and an off state;
 each of the plurality of digital inductors include an inductor and a second digital switch connected together in series or in parallel, the second digital switch being switchable between an on state and an off state; and
 the digital resistor includes only one resistor.

2. The digital variable reactance element according to claim 1, wherein each of the first and second digital switches is a field effect transistor.

3. The digital variable reactance element according to claim 1, wherein the digital resistor is a field effect transistor.

4. A phase shifter, comprising:
 the digital variable reactance element according to claim 1; wherein
 the phase shifter is structured to generate an output signal with a phase corresponding to a digitally varied phase of an input signal.

5. The phase shifter according to claim 4, wherein each of the first and second digital switches is a field effect transistor.

6. The phase shifter according to claim 4, wherein the digital resistor is a field effect transistor.

7. An impedance matching circuit, comprising:
 the digital variable reactance element according to claim 1; wherein
 the impedance matching circuit is structured to match a characteristic impedance to a line connected to the impedance matching circuit.

8. The impedance matching circuit according to claim 7, wherein each of the first and second digital switches is a field effect transistor.

9. The impedance matching circuit according to claim 7, wherein the digital resistor is a field effect transistor.

10. A digital variable reactance element that digitally varies a reactance, the digital variable reactance element comprising:
 a plurality of digital capacitors;
 a plurality of digital inductors; and
 a digital resistor connected in series to the plurality of digital capacitors and the plurality of digital inductors; wherein
 the plurality of digital capacitors and the plurality of digital inductors are connected together in series or in parallel;
 each of the plurality of digital capacitors includes a capacitor and a first digital switch connected together in series or in parallel, the first digital switch being switchable between an on state and an off state;
 each of the plurality of digital inductors include an inductor and a second digital switch connected together in series or in parallel, the second digital switch being switchable between an on state and an off state; and
 the digital resistor includes only one resistor.

11. The digital variable reactance element according to claim 10, wherein each of the first and second digital switches is a field effect transistor.

12. The digital variable reactance element according to claim 10, wherein the digital resistor is a field effect transistor.

13. A phase shifter, comprising:
 the digital variable reactance element according to claim 10; wherein
 the phase shifter is structured to generate an output signal with a phase corresponding to a digitally varied phase of an input signal.

14. The phase shifter according to claim 13, wherein each of the first and second digital switches is a field effect transistor.

15. The phase shifter according to claim 13, wherein the digital resistor is a field effect transistor.

16. An impedance matching circuit, comprising:
 the digital variable reactance element according to claim 10; wherein
 the impedance matching circuit is structured to match a characteristic impedance to a line connected to the impedance matching circuit.

17. The impedance matching circuit according to claim 16, wherein each of the first and second digital switches is a field effect transistor.

18. The impedance matching circuit according to claim 16, wherein the digital resistor is a field effect transistor.

* * * * *